(12) United States Patent
Zhu (10) Patent No.: US 11,385,709 B2
(45) Date of Patent: *Jul. 12, 2022

(54) METHOD AND SYSTEM FOR PROVIDING A SLEEP MODE TO A CONFIGURABLE LOGIC BLOCK USING AN INTERMITTENT POWER SAVING LOGIC

(71) Applicant: GOWIN Semiconductor Corporation, Ltd., GuangZhou (CN)

(72) Inventor: Jinghui Zhu, San Jose, CA (US)

(73) Assignee: GOWIN SEMICONDUCTOR CORPORATION, Ltd., Guangzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/233,344

(22) Filed: Apr. 16, 2021

(65) Prior Publication Data

US 2021/0232209 A1  Jul. 29, 2021

Related U.S. Application Data

(63) Continuation of application No. 16/361,112, filed on Mar. 21, 2019, now Pat. No. 10,990,160.

(51) Int. Cl.

| | |
|---|---|
| *G06F 1/26* | (2006.01) |
| *G06F 1/32* | (2019.01) |
| *G06F 1/3296* | (2019.01) |
| *G06F 30/34* | (2020.01) |
| *G06F 1/3246* | (2019.01) |
| *G06F 1/3234* | (2019.01) |

(52) U.S. Cl.
CPC .......... *G06F 1/3296* (2013.01); *G06F 1/3246* (2013.01); *G06F 1/3278* (2013.01); *G06F 30/34* (2020.01)

(58) Field of Classification Search
CPC .... G06F 1/3246; G06F 1/3278; G06F 1/3287; G06F 1/3296; G06F 30/34; Y02D 10/00; Y02D 30/50
See application file for complete search history.

(56) References Cited

U.S. PATENT DOCUMENTS

| | | | | |
|---|---|---|---|---|
| 7,558,143 B1 * | 7/2009 | Law | ................. | H03K 19/17784 365/228 |
| 8,040,151 B2 * | 10/2011 | Speers | ............. | H03K 19/17784 326/38 |
| 2011/0199118 A1* | 8/2011 | Hill | ................. | H03K 19/17784 326/40 |
| 2020/0014167 A1* | 1/2020 | Rolland | ............... | H01S 3/1307 |

* cited by examiner

*Primary Examiner* — Nitin C Patel
(74) *Attorney, Agent, or Firm* — JW Law Group; James M. Wu (57) ABSTRACT

A programmable semiconductor integrated circuit fabricated on a single microchip device capable of being selectively programmed to perform one or more logic functions provides a sleep mode using an intermittent power saving logic. The circuit includes configurable logic blocks ("LB"), memory, switch, and sleep controller. While LB can enter a power saving sleep mode ("PSSM") in accordance with its power supply, the memory stores the configuration information for the LB. The switch is configured to manage the LB power supply based on a configurable sleep signal for facilitating the PSSM. The sleep controller facilitates generation of the configurable sleep signal in response to the signal from a power saving output port associated with the LB.

15 Claims, 10 Drawing Sheets

METHOD AND SYSTEM FOR PROVIDING A SLEEP MODE TO A CONFIGURABLE LOGIC BLOCK USING AN INTERMITTENT POWER SAVING LOGIC

PRIORITY

This application is a continuation of a U.S. patent application having a Ser. No. 16/361,112, filed on Mar. 21, 2019, and entitled "Method and System for Providing A Sleep Mode to A Configurable Logic Block Using An Intermittent Power Saving Logic," issued with a U.S. Pat. No. 10,990,160 on Apr. 27, 2021, which is hereby incorporated herein by reference.

FIELD

The exemplary embodiment(s) of the present invention relates to the field of computer hardware and software. More specifically, the exemplary embodiment(s) of the present invention relates to low power programmable device such as a field-programmable gate array ("FPGA") or programmable logic device ("PLD").

BACKGROUND

With increasing popularity of digital communication, artificial intelligence (AI), IoT (Internet of Things), and/or robotic controls, the demand for faster and efficient hardware and semiconductors with low power consumption is constantly in demand. To meet such demand, high-speed, flexible design, and low-power semiconductor chips are generally more desirable. Hardware industry typically has a variety of approaches to implement to achieve desirable logical functions.

A conventional approach uses dedicated custom integrated circuits and/or application-specific integrated circuits ("ASICs") to implement desirable functions. A shortcoming with ASIC approach is that this approach is generally expensive and limited flexibility. An alternative approach, which enjoys growing popularity, is utilizing programmable semiconductor devices ("PSD") such as programmable logic devices ("PLDs") or field programmable gate arrays ("FPGAs"). For instance, an end user can program a PSD to perform desirable functions.

A conventional PSD such as PLD or FPGA is a semiconductor chip that includes an array of programmable logic array blocks ("LABs") or logic blocks ("LBs"), routing resources, and input/output ("I/O") pins. Each LAB may further include multiple programmable logic elements ("LEs"). For example, each LAB can include 16 LEs to 128 LEs, wherein each LE can be specifically programmed to perform a function or a set of functions.

With fast changing technologies and rapid market access, the PSD becomes a more viable approach to meet consumer's demand. However, a drawback associated with a conventional PLD or FPGA is that it is less power efficient.

SUMMARY

A programmable semiconductor integrated circuit fabricated a single microchip device capable of being selectively programmed to perform one or more logic functions provides a sleep mode using an intermittent power saving logic. The circuit includes configurable logic blocks ("LB"), memory, switch, and a sleep controller. While LB can enter a power saving sleep mode ("PSSM") in accordance with its power supply, the memory stores the configuration information of the LB. The switch is configured to manage the LB power supply based on a configurable sleep signal for facilitating a sleep duration of the LB. The sleep controller facilitates generation of the configurable sleep signal in response to the signal from a power saving output port associated with the LB.

Additional features and benefits of the exemplary embodiment(s) of the present invention will become apparent from the detailed description, figures and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Embodiments of the present invention disclose a method(s) and/or apparatus for providing a mechanism of dynamic runtime power conservation for a configurable device or programmable semiconductor device ("PSD").

The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be understood that such a development effort might be complex and time-consuming but would nevertheless be a routine undertaking of engineering for those of ordinary skills in the art having the benefit of embodiment(s) of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

In accordance with the embodiment(s) of present invention, the components, process steps, and/or data structures described herein may be implemented using various types of operating systems, computing platforms, computer programs, and/or general-purpose machines. In addition, those of ordinary skills in the art will recognize that devices of a less general-purpose nature, such as hardware devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card and paper tape, and the like) and other known types of program memory.

The term "system" or "device" is used generically herein to describe any number of components, elements, subsystems, devices, packet switch elements, packet switches, access switches, routers, networks, computer and/or communication devices or mechanisms, or combinations of components thereof. The term "computer" includes a processor, memory, and buses capable of executing instruction wherein the computer refers to one or a cluster of computers, personal computers, workstations, mainframes, or combinations of computers thereof.

One embodiment of the presently claimed invention discloses a PSD capable of entering PSSM for power conservation using IPS logic. The PSD is a programmable semiconductor integrated circuit that can be fabricated on a single microchip. The PSD includes programmable LB, configuration logic with a memory, switch, and sleep controller. The programmable or configurable LB contains configurable blocks, arrays, or cells able to be selectively programmed to perform one or more logic functions. The configurable LB or LB can enter the PSSM during runtime operation based on the power supply for power conservation. The configuration logic, in one example, includes a memory which is used to store configuration information used to program the LB when the LB wakes up. It should be noted that the configuration logic is powered on continuously during the running time operation. The switch is configured to manage the power supply such as Vcc power supply to the LB for facilitating sleep durations of the LB. The sleep controller, in one embodiment, is used to generate the sleep signal in response to an output signal from a power saving output port associated with the LB.

Figure 1:
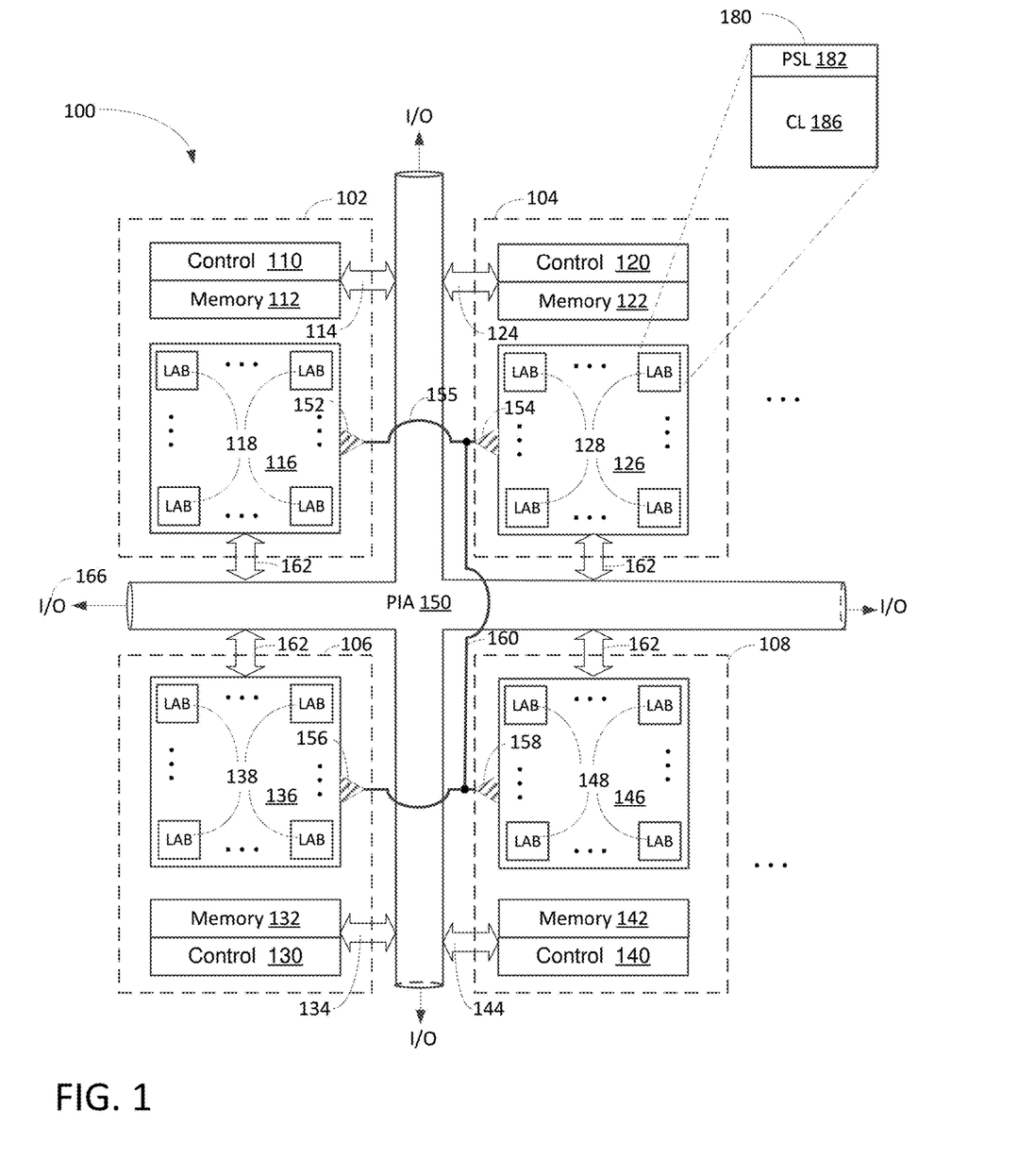
FIG. 1 is a block diagram illustrating a programmable semiconductor device ("PSD") capable of conserving power using intermittent power saving ("IPS") logic in accordance with one embodiment of the present invention.

FIG. 1 is a block diagram 100 illustrating a programmable semiconductor device ("PSD") capable of conserving power using intermittent power saving ("IPS") logic in accordance with one embodiment of the present invention. Diagram 100 includes multiple programmable partitioned regions ("PPR") 102-108, a programmable interconnection array ("PIA") 150, internal power distribution fabric ("PDF") 160, and regional input/output ("I/O") ports 166. PPRs 102-108 further includes control units 110, 120, 130, 140, memory 112, 122, 132, 142, and logic blocks ("LBs") 116, 126, 136, 146. In one aspect, PDF 160 can be a part of PIA 150. Note that control units 110, 120, 130, 140 can be configured into one single control unit, and similarly, memory 112, 122, 132, 143 can also be configured into one single memory device for storing configurations. It should be noted that the underlying concept of the exemplary embodiment(s) of the present invention would not change if one or more blocks (circuit or elements) were added to or removed from diagram 100.

PSD, also known as PLD or FPGA, is being logically and/or physically partitioned in accordance with programmable distribution boundaries or grids such as PPR 102-108. For example, while PPR 102 is fully operational performing various data processing and computing, PPR 104 can be in power saving sleeping mode ("PSSM") with minimal power consumption. PSSM or sleeping mode, in one aspect, is a power conserving mode that powers down most, if not all, LABs within the LB while maintaining the configuration data. In one aspect, the configuration data can be continuously updated while the associated LB is in PSSM or sleeping mode. For example, PSD activates a dynamic runtime power controller ("DRPC") to power down (or power up) LB 126 while providing sufficient power to memory 122 for maintaining configuration data for LB 126.

LBs 116, 126, 136, 146, include multiple LABs 118, 128, 138, 148, wherein each LAB is organized to contain, among other circuits, a set of programmable logical elements ("LEs") or macrocells, not shown in FIG. 1. For example, each LAB can include anywhere from 32 to 512 programmable LEs. I/O pins (not shown in FIG. 1), LABs, and LEs are linked by PIA 150 and/or other buses, such as buses 162, 114, 124, 134, 144, for facilitating communication between PIA 150 and PPRs 102-108. Each LE includes programmable circuits such as the product-term matrix, and registers. For example, every LE can be independently configured to perform sequential and/or combinatorial logic operation(s). It should be noted that the underlying concept of PSD would not change if one or more blocks and/or circuits were added or removed from PSD.

Control units 110, 120, 130, 140, also known as configuration logics, can be a single control unit. Control unit 110, for instance, manages and/or configures individual LE in LAB 118 based on the configuration stored in memory 112. It should be noted that some I/O ports or I/O pins can also be programmed as input pins as well as output pins. Some I/O pins can be further programmed as bi-directional I/O pins that are capable of receiving and sending signals at the same time. The control units such as unit 110 can also be used to handle and/or provide system clock signals for the PSD.

LBs 116, 126, 136, 146 are programmable by the end users. Depending on applications, LBs can be configured to perform user specific functions based on predefined functional library managed by programming software. Based on configurations, a portion of PSD such as PPRs 106-108 can be dynamically powered up or powered down depending on input data and/or data processing. A benefit for shutting down one or more PPRs while maintaining their configurations is to conserve power. PSD, in some applications, also includes a set fixed circuits for performing specific functions. For example, PSD can include a portion of semiconductor area for a fixed non-programmable processor for enhance computation power.

PIA 150 is coupled to LBs 116, 126, 136, 146 via various internal buses such as buses 114, 124, 134, 144, 162. In some embodiments, buses 114, 124, 134, 144, 162 and PDF 160 are part of PIA 150. Each bus includes channels or wires for transmitting signals. It should be noted that the terms channel, routing channel, wire, bus, connection, and interconnection are referred to similar connections and will be used interchangeably herein. PIA 150, not shown in FIG. 1, can also be used to receives and/or transmits data directly or indirectly from/to other devices via I/O pins and LABs.

PSD, in one operation, able to be selectively programmed to perform one or more logic functions includes a first region such as PPR 102 and a second region such as PPR 104 using regional power control ("RPC") ports using connections such as PDF 160. The first region including a set of first LABs can be selectively programmed to perform a first logic function. The second region containing a set of second LABs can also be selectively programmed to perform a second logic function. The RPC ports such as ports 152-158 can be configured to dynamically control power supply to various programmable regions.

PSD, shown in FIG. 1, is organized into four (4) power regions 106-108 wherein each of the four regions can be independently shutdown for conserving power. Alternatively, PSD can be configured to allow each LAB such LAB 180 entering PSSM for conserving power. For example, each LAB such as LAB 180 is further organized into configuration logic portion 186 and power saving logic 182. Depending on the applications, different versions of power saving mechanism can be used to converse power. In yet another embodiment, PSD can be organized into one region depending on the applications.

An advantage of employing IPS logic is to conserve power consumption within PSD by shutting down at least a portion of LAB during runtime execution.

Figure 2:
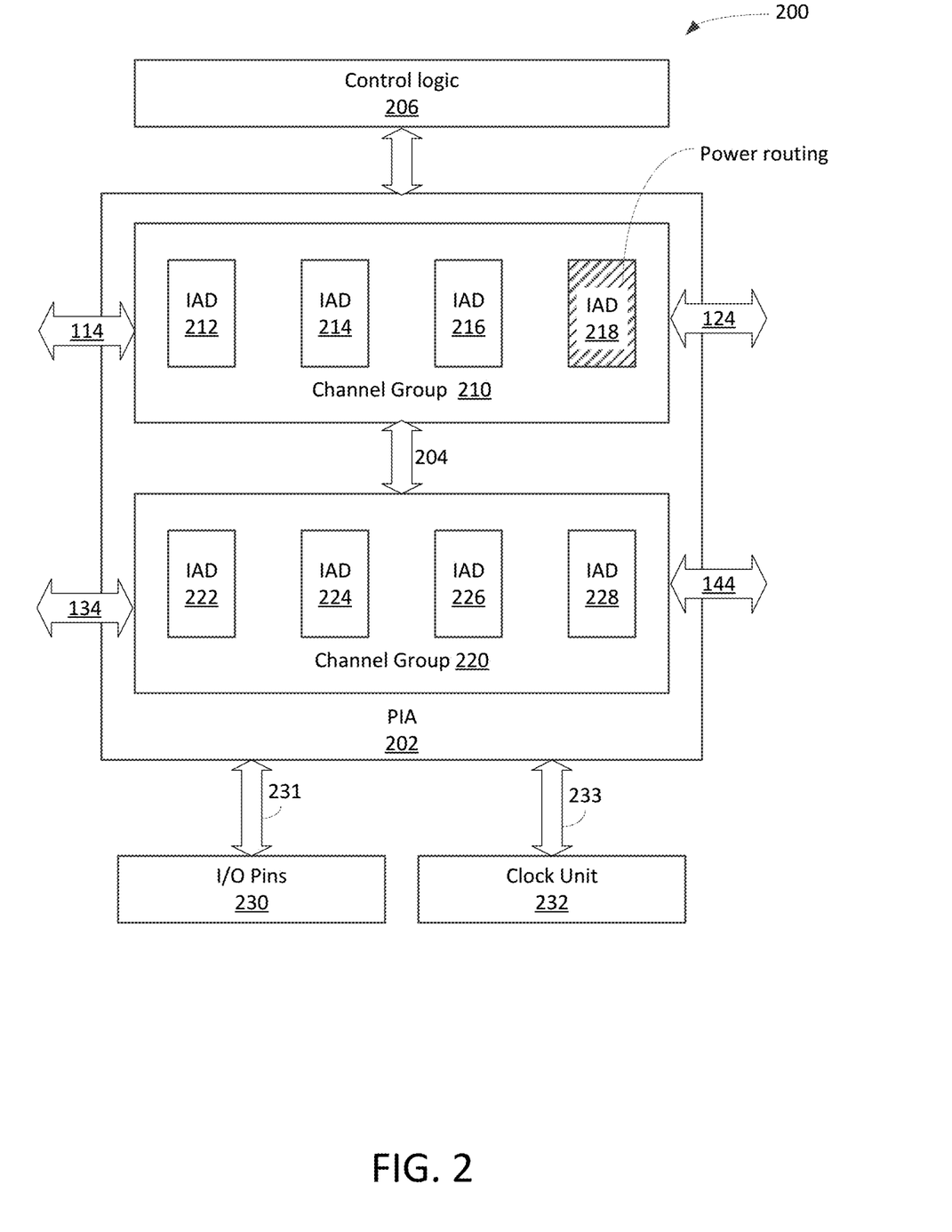
FIG. 2 is a block diagram illustrating a routing logic or routing fabric containing programmable interconnection arrays in PSD in accordance with one embodiment of the present invention.

FIG. 2 is a block diagram 200 illustrating a routing logic or routing fabric containing programmable interconnection arrays in PSD in accordance with one embodiment of the present invention. Diagram 200 includes control logic 206, PIA 202, I/O pins 230, and clock unit 232. Control logic 206, which may be similar to control units shown in FIG. 1, provides various control functions including channel assignment, differential I/O standards, and clock management. Control logic 206 can includes volatile memory, non-volatile memory, and/or a combination of volatile and nonvolatile memory device. The memory devices include, but not limited to, flash memory, electrically erasable programmable read-only memory ("EEPROM"), erasable programmable read-only memory ("EPROM"), fuses, anti-fuses, magnetic RAM ("MRAM"), SRAM, Dynamic Random-Access Memory ("DRAM"), and/or ROM, for storing data as well as configuration. In one embodiment, control logic 206 is incorporated into PIA 202. It should be noted that the underlying concept of the exemplary embodiment(s) of the present invention would not change if one or more blocks (circuit or elements) were added to or removed from diagram 200.

I/O pins 230, in one example, connected to PIA 202 via a bus 231, includes multiple programmable I/O pins that can receive and transmit signals to outside of PSD. Each programmable I/O pin, for instance, can be configured as to whether it is an input, output, and/or bi-directional pin. I/O pins 230 may be incorporated into control logic 206 depending on applications.

Clock unit 232, in one example, connected to PIA 202 via a bus 233, receives various clock signals from other components, such as a clock tree circuit or a global clock oscillator. Clock unit 232, in one instance, generates clock signals in response to system clocks as well as reference clocks for implementing I/O communications. Depending on the applications, clock unit 232 provides clock signals to PIA 202 including reference clock(s).

PIA 202, in one aspect, is organized in an array scheme having multiple channel groups 210 and 220, bus 204, and I/O buses 114, 124, 134, 144. Channel groups 210, 220 are used to facilitate routing information between LBs based on PIA configurations. Channel groups can also communicate with each other via internal buses or connections such as bus 204. Channel group 210 further includes interconnect array decoders ("IADs") 212-218 and channel group 220 includes four IADs 222-228. A function of IAD is to provide a configurable routing resources for data transmission.

For example, an IAD such as IAD 212 includes routing circuits, such as routing multiplexers or selectors, hereinafter called multiplexers, for routing various signals between I/O pins, feedback outputs, and LAB inputs. Each IAD is organized in a number of multiplexers for routing various signals received by IAD. For example, an IAD can include 36 multiplexers which can be laid out in four banks that each bank contains nine rows of multiplexers. Thus, each bank of IAD, for instance, can choose any one or all of the nine multiplexers to route one or nine signals that IAD receives. It should be noted that the number of IADs within each channel group is a function of the number of LEs within the LAB. In one embodiment, IAD is programmable and it can be configured to route the signals in a most efficient way. To enhance routability, IAD employs configurable multiplexing structures so that a configurable mux allows a portion of its mux to be used by another mux in an adjacent IAD.

In one embodiment, PIA 202 is configured to designate a special IAD such as IAD 218 as a power routing IAD. For example, IAD 218 is configured to dynamically facilitate and/or control power to certain PPR(s) during runtime. It should be noted that dynamic power supply during runtime can be referred to as automatic power-up or power-down PPR for power conservation during runtime.

An advantage of using IAD 218 within PIA as a designated power routing is that PDF can be configured to be a part of PIA.

Figure 3:
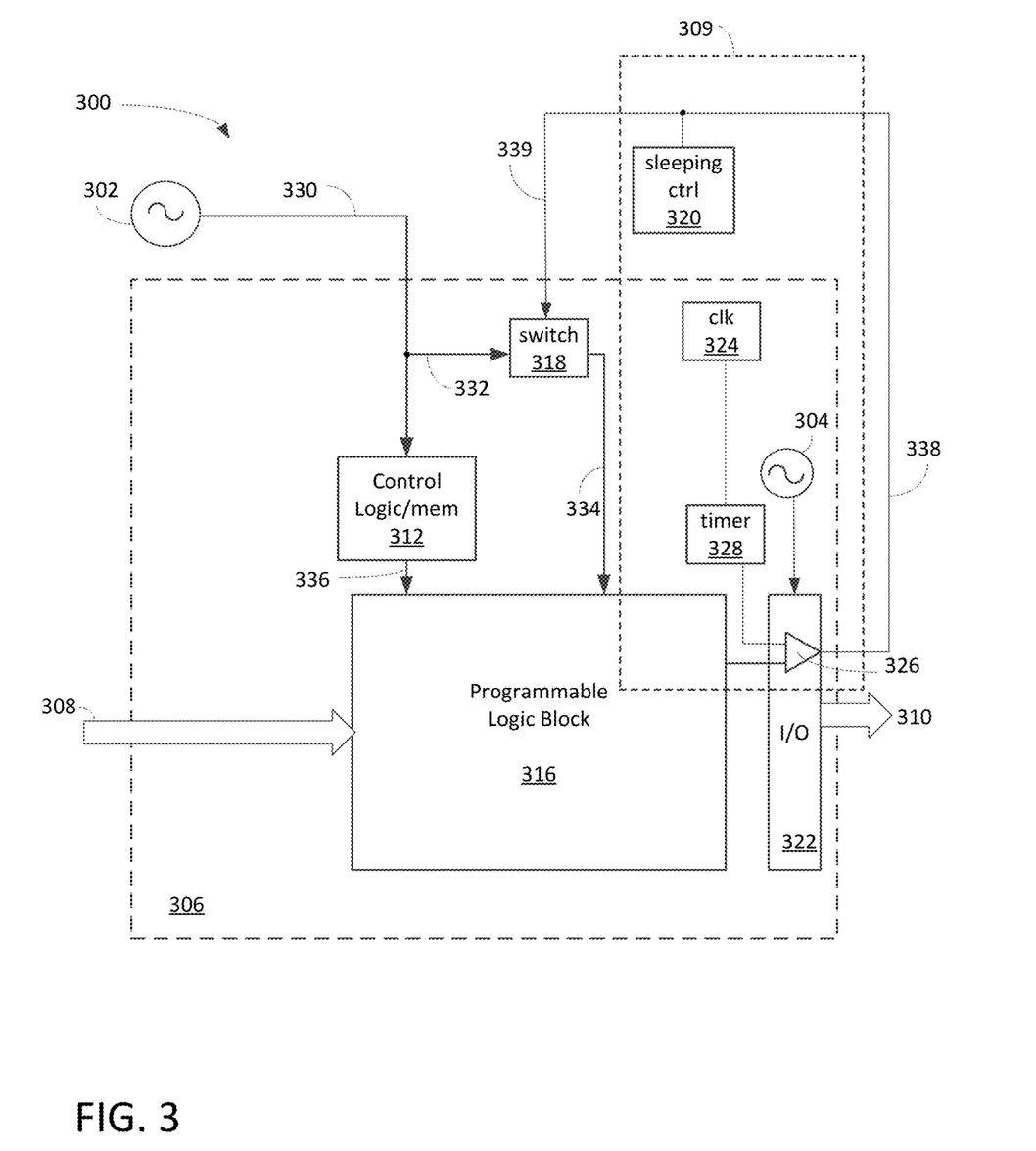
FIG. 3 is a block diagram illustrating an integrated circuit ("IC") for PSD capable of providing a power saving sleep mode ("PSSM") to at least a portion of PSD using IPS logic in accordance with one embodiment of the present invention.

FIG. 3 is a block diagram 300 illustrating an integrated circuit ("IC") for PSD capable of providing a power saving sleep mode ("PSSM") to at least a portion of PSD using IPS logic in accordance with one embodiment of the present invention. Diagram 300 includes a programmable logic chip 306, Vcc 302, pull-up power source 304, and IPS logic 309. Vcc 302 is a power supply having an rang of voltage from three (3) volts to seven (7) volts depending on the applications. Pull-up power source 304 is used to provide high impedance for open circuits or terminals. It should be noted that the underlying concept of the exemplary embodiment(s) of the present invention would not change if one or more blocks (circuit or elements) were added to or removed from diagram 300.

Microchip or chip 306 is a low-power programmable semiconductor device capable of being selectively programmed to perform one or more logic functions. Microchip 306, in one embodiment, includes a first circuit 316, second circuit 312, switch 318, and at least a portion of IPS logic 309. First circuit 316, in one example, contains a set of configurable logic blocks ("LB") or LAB able to be selectively programmed to perform one or more logic functions. In one aspect, first circuit 316 is a programmable or configurable LB which can be programmed, instructed, or placed into the PSSM based on the power supply or Vcc such as power supply 302. To simplify forgoing discussion, the terms "configurable LB," "programmable LB," LAB, "configurable LBs," and "LB" mean similar or same devices and they can be used interchangeably.

Second circuit 312 coupled to Vcc 302 and LB 316 is a control logic. In one example, control logic 312 receives power from Vcc 302 via connection 330. A function of control logic 312 is to program LB 316 via connection 336 using information stored in its memory. For example, the configuration information can be used to program the programmable LB 316 when it wakes up after the PSSM. Control logic 312, in one embodiment, includes a processor or controller for managing and controlling operations of programming to LB 316 based on the configuration information in the memory.

Switch 318, in one embodiment, is coupled to a power source such as Vcc 302 via connections 330-332 and is capable of supplying power to LB 316. It should be noted that different power source may be employed since the power requirements between LB 316 and control logic 312 can be different. For example, switch 318 which can be an adjustable or configurable device manages the power supply to LB 316 according to a configurable sleep signal over connection 339 from IPS logic 309. Note that the configurable sleep signal facilitates sleep durations or wake cycles for LB 316. Switch 318, in one aspect, can be a transistor capable of controlling power supply from a power source such as Vcc 302 to LB 316 based on value of the configurable sleep signal as well as output of sleeping controller 320.

The value of configurable sleep signal carried by connection 339 determines whether switch 318 is logically "on" or "off". If switch 318 is on, the power supply such as Vcc 302 provides power to LB 316 via connections 330-334 through switch 318. Conversely, if switch 318 is off, the power supply such as Vcc 302 is turned off by switch 318 at connection 334 whereby LB 316 goes into sleep mode or PSSM when the power supply shuts off.

During operation, when the configuration sleep signal is set or logic one "1" that turns on switch 318, the power source such as Vcc 302 supplies power to LB 316 via connections 330-334. When the configuration sleep signal is unset or logic zero "0" that turns off switch 318, the power source such as Vcc 302 stops supplying power to LB 316 because the power over connection 334 turns off. When LB 316 fails to receive the power on connection 334, LB 316 is programmed to phase into the PSSM. LB 316 generally consumes small amount or limited power when it is in the PSSM.

IPS logic 309, in one embodiment, includes a sleep controller 320, clock 324, timer 328, and power saving port 326. A function of IPS logic 309 is to facilitate a power saving scheme during a runtime execution or operation. IPS logic 309 is used to periodically turn off and turn on LB 316 during a runtime operation. For instance, a portion of LB 316 programmed to perform an interface function of a stylus or digital pen can be periodically placed into the PSSM during an active writing process because LB 316 does not need to be awake all the time. For example, LB 316 may be required to check the interface of digital pen every 100 milli-seconds.

Sleeping controller 320, in one embodiment, is a charge pump configured to assist generation of the configurable sleep signal according to the output signal at connection 338 sent from a power saving output port 326. In one example, power saving output port 326 is a part of I/O block 322 associated with LB 316. In one aspect, sleep controller 320 includes a programmable capacitor which can be programmed to determine the duration of sleep cycle for LB 316.

I/O block 322 is coupled to configurable LB 316 and includes a set of I/O ports for input and output data to and from LB 316. The set of I/O ports includes at least one power saving output port 326 which is used for the PSSM. I/O block 322 is further coupled to a second power source 304, also known as pull-up power source, used for supplying a pull-up voltage or high impedance to the I/O ports for preventing current flow through the I/O ports during the PSSM.

Timer 328, in one embodiment, can be a digital programmable counter clocked by clock 324 to generate a start-sleep signal used to initiate the process of PSSM. In one aspect, timer 328 is programmable so that a user can configure the sleeping or wake duration based on the applications. For example, a sleeping duration for a keystroke operation can be longer than a sleeping duration for a visual/audio operation.

During an operation, when timer 328 initiates a start-sleep signal according to, for example, internal counting in response to clock cycles generated by clock 324, the start-sleep signal forces a zero or unset output value at power saving output port 326. When switch 318 receives low or zero voltage of the configuration sleep signal over connection 339, switch 318 shuts off Vcc 302 from providing power to LB 316 whereby LB 316 enters the PSSM. Upon seeing zero voltage at power saving output port 326 and connection 338, pull-up power supply 304 begins to pull up the voltage to hi impedance ("Hi-Z") to prevent current flow to and from the I/O ports at I/O block 322. When the voltage level begins to rise to Hi-Z, sleeping controller 320 starts to store charges. Once the capacitor in sleep controller 320 is fully charged, the voltage level begins to rise on connection 339 in response to the charges stored in the capacitor as well as pull-up voltage. When the voltage level at connection 339 reaches the threshold voltage of switch 318, switch 318 turns on allowing Vcc 302 to supply power to LB 316 via connection 334. LB 316 begins to operate after it is configured based on the information stored in memory 312. It should be noted that power to control logic stays on during the PSSM so that the configuration information is maintained at all time. The power saving cycle repeats.

An advantage of using the IPS logic is to conserve power consumption by periodically shutting down at least a portion of LB during a runtime operation implemented in a single chip low-power PSD.

Figure 4:
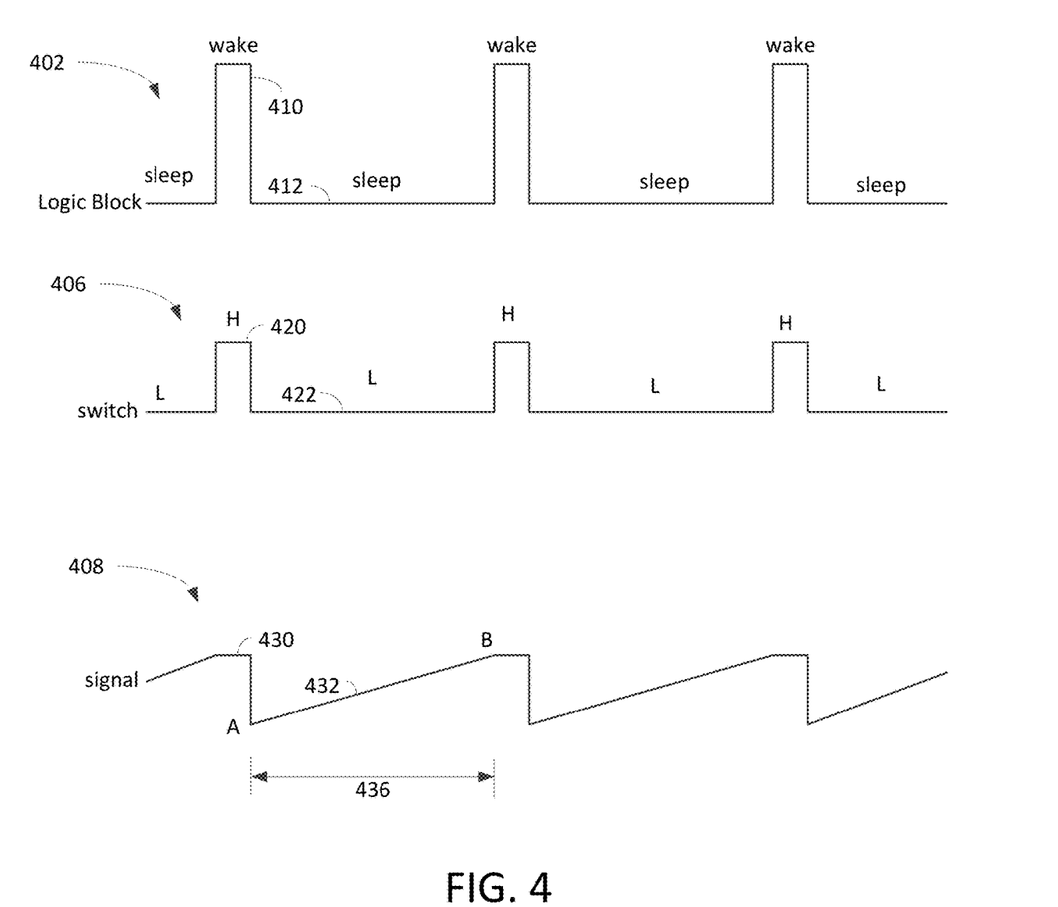
FIG. 4 illustrates timing diagrams showing logic and/or analog timing diagrams for operations of PSSM using IPS logic in accordance with one embodiment of the present invention.

FIG. 4 illustrates timing diagrams 402-408 showing logic and/or analog timing diagrams for operations of PSSM using IPS logic in accordance with one embodiment of the present invention. Diagram 402 illustrates a timing waveform of PSSM for LB wherein wake period 410 is shorter than sleeping period 412. Diagram 402, in this example, shows that roughly 90% of time LB is in PSSM. Depending on the applications, the waveform between wake period and sleep period can change. Diagram 406 illustrates that a logical waveform of configuration sleep signal for driving the switch. When the configuration sleep signal is high as indicated by numeral 420, the switch is turned on and when the configuration sleep signal is low as indicated by numeral 422, the switch is turned off.

Diagram 408 illustrates an analog waveform of configuration sleep signal for controlling the switch. When the configuration sleep signal is high as indicated by numeral 430, the switch is turned on and when the configuration sleep signal is low as indicated by numeral 432, the switch is turned off. It should be noted that the configuration sleep signal rises gradually from point A to point B over the analog off-waveform 436. It should be noted that the ramp-up formation duration waveform 436 indicates the accumulative voltage from the pull-up voltage plus charges stored by the sleeping controller.

Figure 5A:
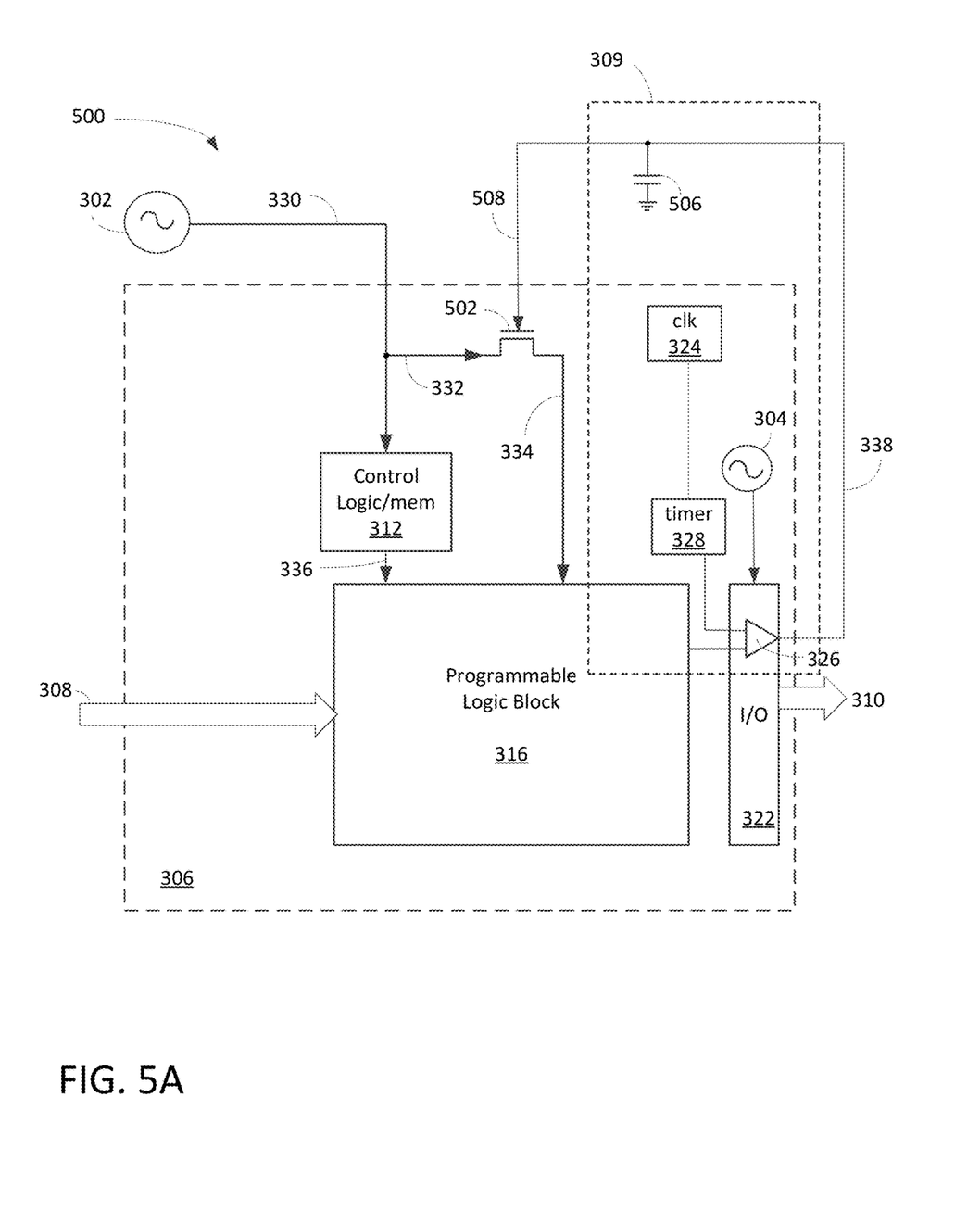
FIG. 5A is a block diagram illustrating a low-power PSD capable of conserving power by periodically shutting down a portion of LB in accordance with one embodiment of the present invention.

FIG. 5A is a block diagram 500 illustrating a low-power PSD capable of conserving power by periodically shutting down a portion of LB in accordance with one embodiment of the present invention. Diagram 500 includes a programmable logic chip 306, Vcc 302, pull-up power source 304, and IPS logic 309. Vcc 302 is a power supply having a power supplying range of voltage from three (3) volts to seven (7) volts depending on the applications. Pull-up power source 304 is used to provide high impedance for open circuits or terminals. It should be noted that the underlying concept of the exemplary embodiment(s) of the present invention would not change if one or more blocks (circuit or elements) were added to or removed from diagram 500.

Diagram 500 is similar to diagram 300 shown in FIG. 3 except that switch 502 and sleeping controller 506. In one embodiment, switch 502 is a transistor configured to turn on and turn off based on the gate voltage 508. Also, sleeping controller 506 can be a programmable capacitor capable of storing charges based on the voltage level on connection 338.

An advantage of using the low-power PSD is that it can provide single chip solution which is capable of periodically turning off a portion of LB for power conservation. Such applications are useful in portable devices as well as artificial intelligent ("AI") applications because many logic devices in such systems need not to be operable until certain data becomes available.

Figure 5B:
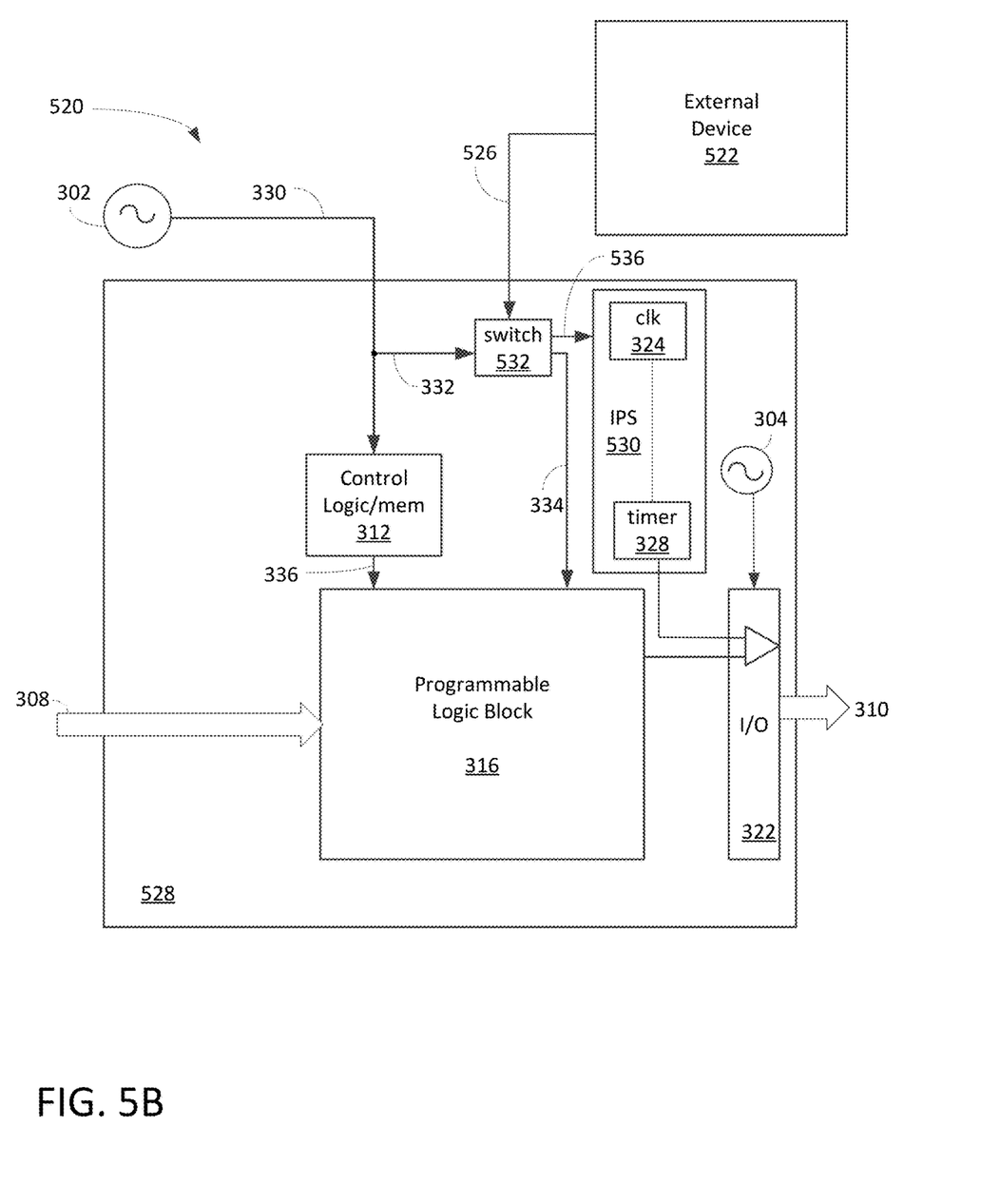
FIG. 5B is a block diagram illustrating a low-power PSD capable of periodically shutting down a portion of LB driven by an external device in accordance with one embodiment of the present invention.

FIG. 5B is a block diagram 520 illustrating a low-power PSD capable of periodically shutting down a portion of LB according to a secondary external device in accordance with one embodiment of the present invention. Diagram 520 includes a PSD 528 and an external or secondary device 522 wherein secondary device 522 can be a timing controller or a host CPU (central processing unit). For example, PSD 528 and device 522 are coupled via a printed circuit board ("PCB") or a semiconductor multi-chip module, but PSD 528 and device 522 are separately fabricated into two semiconductor microchips. It should be noted that the underlying concept of the exemplary embodiment(s) of the present invention would not change if one or more blocks (circuit or elements) were added to or removed from diagram 520.

PSD 528, in one aspect, is similar to PSD 306 shown in FIG. 3 except that PSD 528 includes a configurable switch 532 and a selectable IPS logic 530. Selectable IPS logic 530 is an internal power saving circuit capable of performing similar functions as IPS logic 309 shown in FIG. 3 except that IPS logic 530 can be turned off by signals over connection 536 from switch 532. For example, when an external secondary device 522 is present and notifies switch 532, switch 532 is capable to selectively receiving sleeping signals from either IPS logic 530 or secondary device 522 depending on the configurations.

In operation, secondary device 522 sends a sleeping signal 526 to switch 532 for initiating a PSSM to at least a portion of LBs or LABs in PSD 528. Upon receiving the sleeping signal from device 522, switch 532 turns off input from IPS logic 530 once the authenticity of device 522 is verified. PSD 528, for example, can be an FPGA or PLD containing various low-power LABs capable of entering PSSM periodically during an active operation.

To implement a scenario of external control for entering a PSSM for one or more LABs, a feature of internal IPS logic 530 is that it allows to be turned off. In one embodiment, secondary device 522 provides sleeping signals and/or wake signals to switch 532 based on the applications. Switch 532 is able to turn off and turn on power supply to LB 316 based on signals received from secondary device 522. LE 316 enters a PSSM when the power is off and LE 316 wakes up when the power is on.

An advantage of turning off IPS logic is that it provides additional flexibility by allowing an external device to drive the PSD for power conservation.

Figure 6:
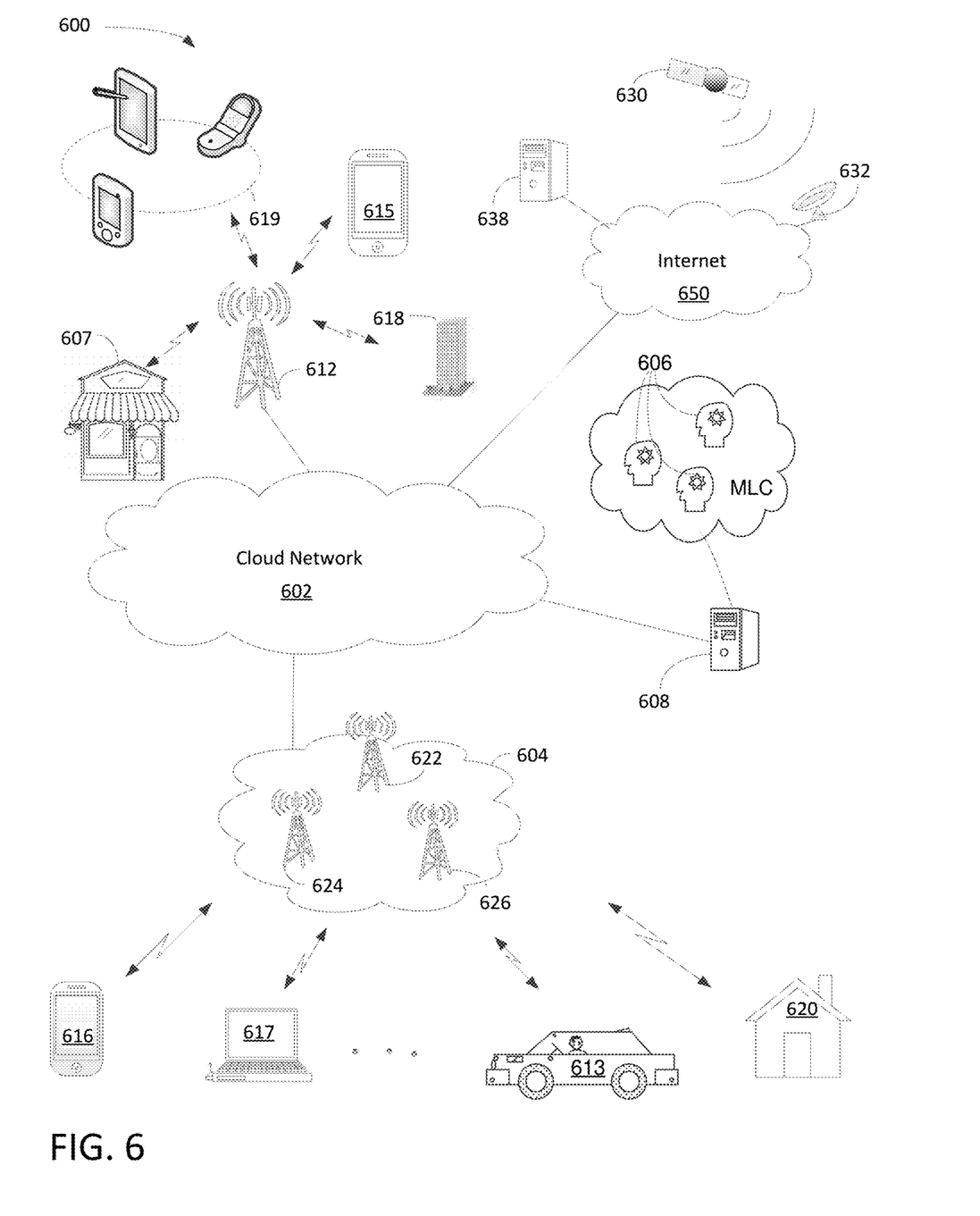
FIG. 6 is a block diagram illustrating various systems connected to a cloud-based communication network using IPS logic to provide low-power PSD in accordance with one embodiment of the present invention.

FIG. 6 is a block diagram 600 illustrating various systems connected to a cloud-based communication network using IPS logic to provide low-power PSD in accordance with one embodiment of the present invention. Diagram 600 illustrates AI server 608, communication network 602, switching network 604, Internet 650, and portable electric devices 613-619. In one aspect, low-power PSD can be used in AI server, portable electric devices, and/or switching network. Network or cloud network 602 can be wide area network ("WAN"), metropolitan area network ("MAN"), local area network ("LAN"), satellite/terrestrial network, or a combination of WAN, MAN, and LAN. It should be noted that the underlying concept of the exemplary embodiment(s) of the present invention would not change if one or more blocks (or networks) were added to or removed from diagram 600.

Network 602 includes multiple network nodes, not shown in FIG. 6, wherein each node may include mobility management entity ("MME"), radio network controller ("RNC"), serving gateway ("S-GW"), packet data network gateway ("P-GW"), or Home Agent to provide various network functions. Network 602 is coupled to Internet 650, AI server 608, base station 612, and switching network 604. Server 608, in one embodiment, includes machine learning computers ("MLC") 606 using partitioned PSD with DRPC for power conservation.

Switching network 604, which can be referred to as packet core network, includes cell sites 622-626 capable of providing radio access communication, such as 3G ($3^{rd}$ generation), 4G, or 5G cellular networks. Switching network 604, in one example, includes IP and/or Multiprotocol Label Switching ("MPLS") based network capable of operating at a layer of Open Systems Interconnection Basic Reference Model ("OSI model") for information transfer between clients and network servers. In one embodiment, switching network 604 is logically coupling multiple users and/or mobiles 616-620 across a geographic area via cellular and/or wireless networks. It should be noted that the geographic area may refer to a campus, city, metropolitan area, country, continent, or the like.

Base station 612, also known as cell site, node B, or eNodeB, includes a radio tower capable of coupling to various user equipments ("UEs") and/or electrical user equipments ("EUEs"). The term UEs and EUEs are referring to the similar portable devices and they can be used interchangeably. For example, UEs or PEDs can be cellular phone 615, laptop computer 617, iPhone® 616, tablets and/or iPad® 619 via wireless communications. Handheld device can also be a smartphone, such as iPhone®, BlackBerry®, Android®, and so on. Base station 612, in one example, facilitates network communication between mobile devices such as portable handheld device 613-619 via wired and wireless communications networks. It should be noted that base station 612 may include additional radio towers as well as other land switching circuitry.

Internet 650 is a computing network using Transmission Control Protocol/Internet Protocol ("TCP/IP") to provide linkage between geographically separated devices for communication. Internet 650, in one example, couples to supplier server 638 and satellite network 630 via satellite receiver 632. Satellite network 630, in one example, can provide many functions as wireless communication as well as global positioning system ("GPS"). In one aspect, partitioned PSD with DRPC can be used in all applicable devices, such as, but not limited to, smartphones 613-619, satellite network 630, automobiles 613, AI server 608, business 607, and homes 620.

An advantage of employing low-power PSD is to facilitate power conservation in a network (or IA) environment.

The exemplary embodiment of the present invention includes various processing steps, which will be described below. The steps of the embodiment may be embodied in machine or computer executable instructions. The instructions can be used to cause a general purpose or special purpose system, which is programmed with the instructions, to perform the steps of the exemplary embodiment of the present invention. Alternatively, the steps of the exemplary embodiment of the present invention may be performed by specific hardware components that contain hard-wired logic for performing the steps, or by any combination of programmed computer components and custom hardware components.

Figure 7A:
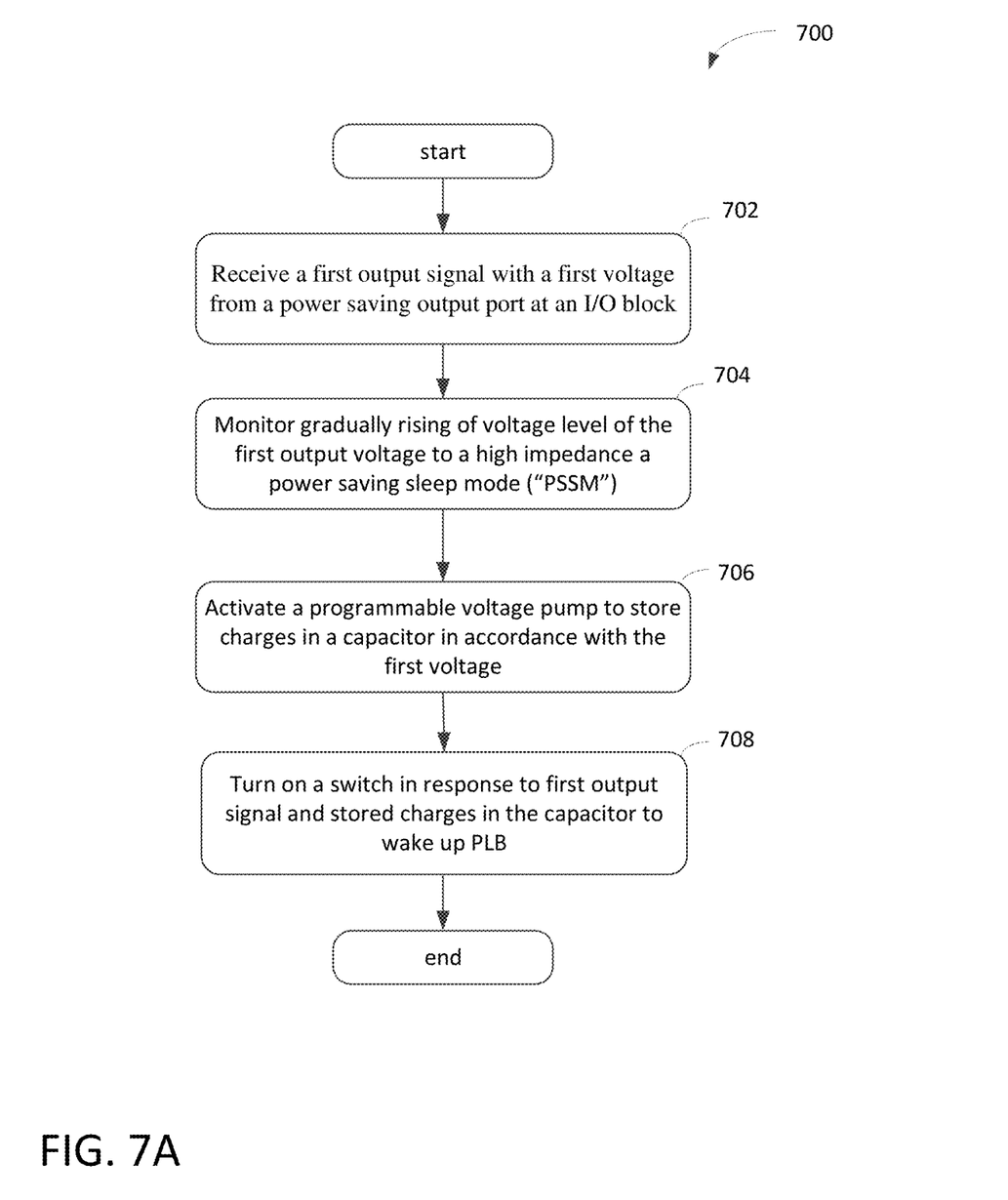
FIGS. 7A-B are flowcharts illustrating one or more processes of power conservation in PSD using IPS logic in accordance with one embodiment of the present invention.

FIG. 7A is a flowchart illustrating one or more processes of power conservation in PSD using IPS logic in accordance with one embodiment of the present invention. At block 702, a process of low-power configurable semiconductor chip capable of periodically turning off a portion of a programmable logic for power conservation receives an output signal with a first voltage from a power saving output port at an I/O block. For example, when a sleep cycle is initiated by an internal timer, a relatively low voltage signal is provided or forced to the power saving output port.

At block 704, the first output voltage is gradually rising to a high impedance ("Hi-Z") indicating that at least a portion of a programmable logic block ("PLB") or LB is in a PSSM. It should be noted that Hi-Z prevents any communication between the PLB and external devices when voltage reaches Hi-Z.

At block 706, a programmable voltage pump is activated to store charges in a capacitor in accordance with the first voltage. It should be noted that a user is able to program or configure the voltage pump to adjust sleeping cycles. A function of voltage pump is to store charges which facilitates the duration of sleeping cycle as well as wake cycle.

At block 708, the process is capable of turning on a switch in response to the first output signal and the stored charges in the capacitor to wake up at least a portion of sleeping PLB by supplying power to the sleeping PLB. For example, the electrical power is drawn from Vcc (or power supply) to the PLB which will wake up the sleeping PLB based on the configuration data stored in a nonvolatile memory. In one embodiment, upon driving a zero-voltage representing logic zero on an output signal at the power saving output port for facilitating placing at least a portion of the PLB into the PSSM, I/O ports in the I/O block are pulled up to the Hi-Z when the PLB is in the PSSM. It should be noted that the process is capable of generating a logic zero voltage periodically by a timer at the power saving output port for facilitating the PSSM.

Figure 7B:
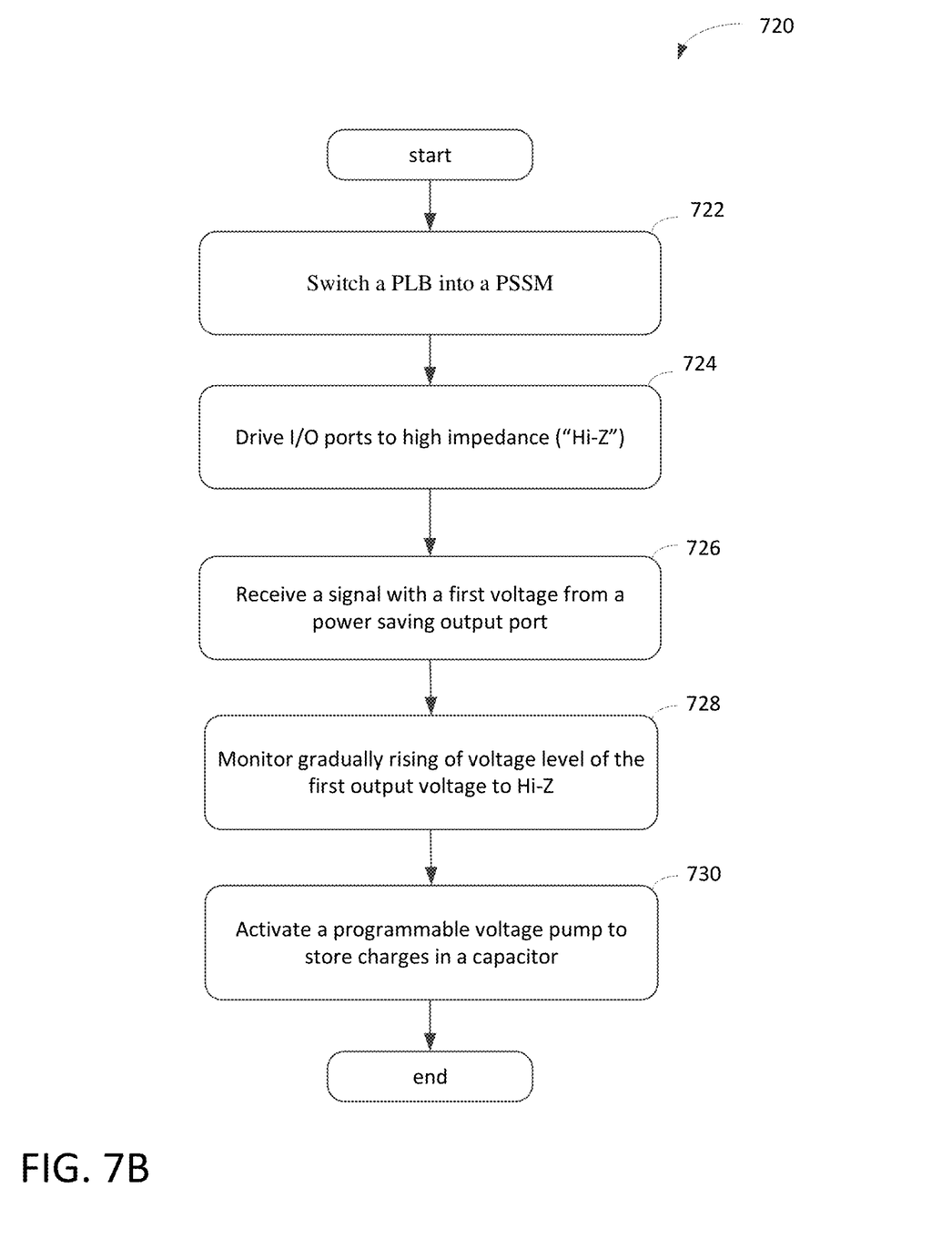

FIG. 7B is a flowchart 720 illustrating one or more processes of low-power PSD using IPS logic in accordance with one embodiment of the present invention. At block 722, a process of semiconductor chip capable of periodically turning off a portion of LB for power conservation is able to switch a programmable logic block ("PLB") or LB into a PSSM when a switch of power control is turned off. At block 724, upon driving I/O ports of I/O block to Hi-Z for minimizing current flows through the I/O ports, an output signal with a first voltage, at block 726, is received from a power saving output port of the plurality of I/O ports. At block 728, the process is capable of monitoring gradually rising of voltage level of the first output voltage to Hi-Z. At block 730, a programmable voltage pump is activated to store charges in a capacitor in accordance with the first voltage. In one example, the process is able to turn on the switch in response to the first output signal and the stored charges in the capacitor to wake up the PLB. The process is further capable of generating a logic zero voltage periodically by a timer for facilitating activation of the PSSM.

Figure 8:
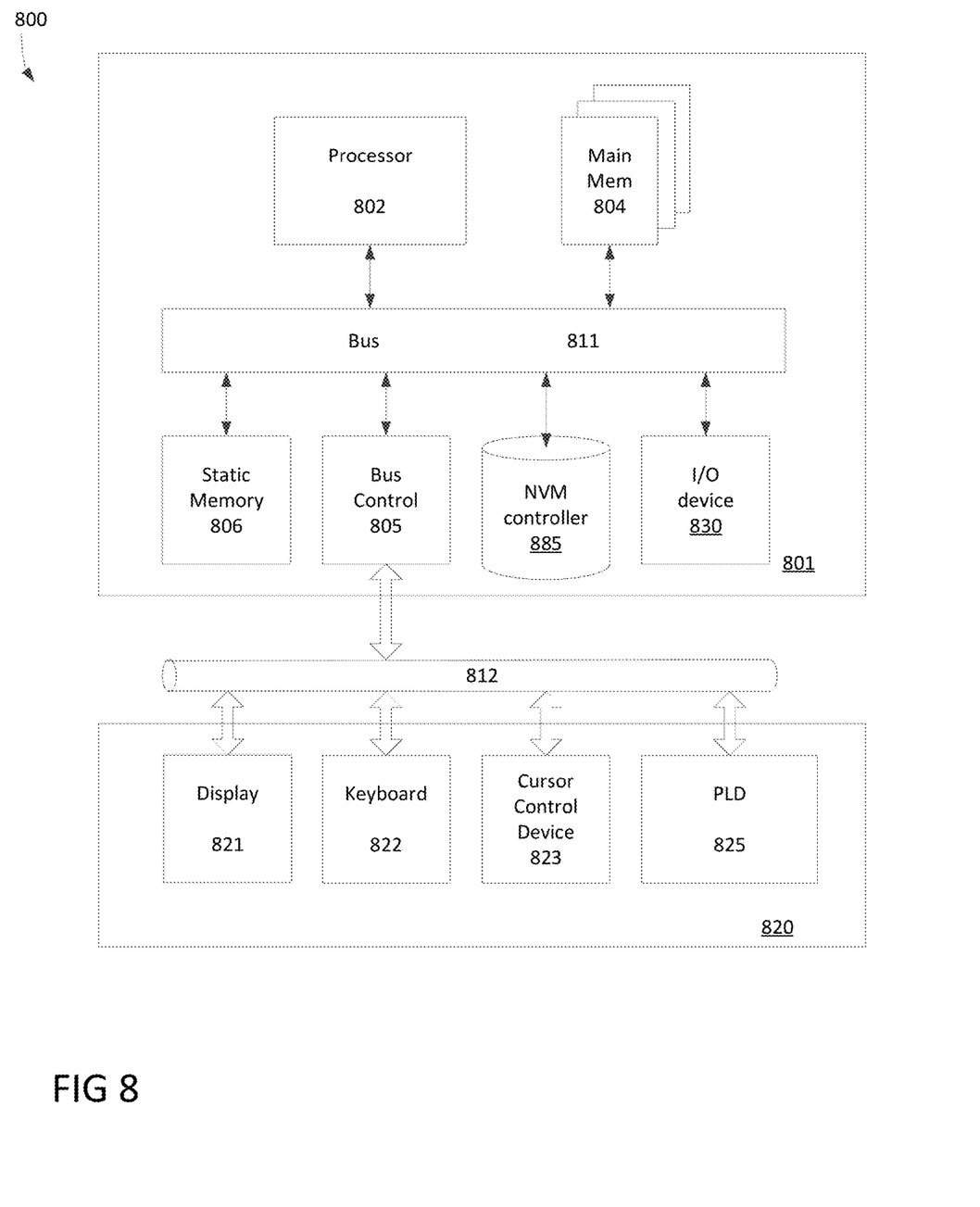
FIG. 8 is a diagram illustrating a digital processing system using PSD with IPS logic for power conservation in accordance with one embodiment of the present invention.

FIG. 8 is a diagram illustrating a digital processing system 800 using PSD with IPS logic for power conservation in accordance with one embodiment of the present invention. Computer system 800 can include a processing unit 801, an interface bus 812, and an input/output ("IO") unit 820. Processing unit 801 includes a processor 802, main memory 804, system bus 811, static memory device 806, bus control unit 805, I/O element 830, and NVM controller 885. It should be noted that the underlying concept of the exemplary embodiment(s) of the present invention would not change if one or more blocks (circuit or elements) were added to or removed from FIG. 8.

Bus 811 is used to transmit information between various components and processor 802 for data processing. Processor 802 may be any of a wide variety of general-purpose processors, embedded processors, or microprocessors such as ARM® embedded processors, Intel® Core™ Duo, Core™ Quad, Xeon®, Pentium™ microprocessor, Motorola™ 68040, AMD® family processors, or Power PC™ microprocessor.

Main memory 804, which may include multiple levels of cache memories, stores frequently used data and instructions. Main memory 804 may be RAM (random access memory), MRAM (magnetic RAM), or flash memory. Static memory 806 may be a ROM (read-only memory), which is coupled to bus 811, for storing static information and/or instructions. Bus control unit 805 is coupled to buses 811-812 and controls which component, such as main memory 804 or processor 802, can use the bus. Bus control unit 805 manages the communications between bus 811 and bus 812. Mass storage memory or SSD which may be a magnetic disk, an optical disk, hard disk drive, floppy disk, CD-ROM, and/or flash memories are used for storing large amounts of data.

I/O unit 820, in one embodiment, includes a display 821, keyboard 822, cursor control device 823, and low-power PLD 825. Display device 821 may be a liquid crystal device, cathode ray tube ("CRT"), touch-screen display, or other suitable display device. Display 821 projects or displays images of a graphical planning board. Keyboard 822 may be a conventional alphanumeric input device for communicating information between computer system 800 and computer operator(s). Another type of user input device is cursor control device 823, such as a conventional mouse, touch mouse, trackball, or other type of cursor for communicating information between system 800 and user(s).

Low-power PLD is coupled to bus 811 for providing configurable logic functions to local as well as remote computers or servers through wide-area network. For example, PLD 825 can be configured to be a modem or a network interface device, or other similar devices that facilitate communication between computer 800 and the network. Computer system 800 may be coupled to a number of servers via a network infrastructure such as the infrastructure illustrated in FIG. 6.

While particular embodiments of the present invention have been shown and described, it will be obvious to those of ordinary skills in the art that based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. A semiconductor device selectively programmed to perform one or more logic functions with a power saving block, comprising:
    a first integrated circuit ("IC") configured to provide a sleeping signal for initiating a power saving sleep mode ("PSSM") for at least a portion of a programmable block;
    an intermittent power saving ("IPS") logic, coupled to the first IC, configured to be switched off in response to the sleep signal and provide a PSSM control signal for placing at least a portion of the configurable LBs into the PSSM during an operation; and
    a second IC coupled to the first IC and configured to perform user defined logic functions based on configuration data, the second IC includes:
    a memory for storing at least a portion of the configuration data for configuring at least a portion of the programmable block,
    a plurality of configurable logic blocks ("LBs") configured to be selectively programmed to perform one or more logic functions in accordance with the configuration data, wherein at least a portion of the configurable LBs is configured to enter the PSSM in accordance with the sleeping signal.

2. The device of claim 1, further comprising a switch coupled to the plurality of configurable LBs and configured to switch on at least a portion of the plurality of configurable LBs based on the sleep signal via a power supply when the portion of the plurality of configurable LBs is in the PSSM.

3. The device of claim 1, further comprising a switch coupled to the plurality of configurable LBs and configured to switch off at least a portion of the plurality of configurable LBs based on deactivation of the sleep signal via disconnecting a power supply when the portion of the plurality of configurable LBs is in the PSSM.

4. The device of claim 1, further comprising an input and output ("I/O") block coupled to the plurality of configurable LBs and configured to have a plurality of I/O ports including a power saving output port.

5. The device of claim 4, wherein the I/O block is coupled to a second power supply for supplying a voltage to the plurality of I/O ports to create a high impedance to one or more I/O ports for preventing current flow through the plurality of I/O ports during the PSSM.

6. The device of claim 1, further comprising a timer coupled to an input and output ("I/O") block and configured to initiate a process of PSSM.

7. The device of claim 1, wherein the second IC is a field-programmable gate array ("FPGA") programmed to perform various logic functions.

8. A system containing a microchip configured to perform the PSSM comprising the device of claim 1.

9. An apparatus containing programmable logic blocks having a power saving logic, comprising:
    configurable logic blocks ("LBs") configured to be selectively programmed to perform one or more logic functions and configured to enter a power saving sleep mode ("PSSM") in response to a PSSM control signal;
    a control logic coupled to the configurable LBs and having a memory for storing configuration information for programming the configurable LBs; and
    an intermittent power saving ("IPS") logic coupled to the configurable LBs and configured to provide the PSSM control signal to control when at least a portion of the configurable LBs enters the PSSM, wherein the IPS logic includes a power saving output port configured to facilitate an output voltage during the PSSM and a pull-up power source to gradually rising of voltage level of the output voltage to a high impedance ("Hi-Z") in response to output value of the power saving output.

10. The apparatus of claim 9, further comprising a switch coupled to the configurable LBs and configured to manage power supply to the configurable LBs based on the PSSM control signal.

11. The apparatus of claim 9, wherein the IPS logic is configured to be turned off via a sleep signal from an external device.

12. The apparatus of claim 9, wherein the IPS logic includes:
    a sleeping circuit configured to control power supply to at least a portion of the configurable LBs; and
    a timer coupled to the sleeping circuit and configured to initiate a process of PSSM.

13. The apparatus of claim 9, further comprising an input and output ("I/O") block coupled to the configurable LBs and configured to have a plurality of I/O ports including a power saving output port.

14. A method of semiconductor chip periodically restoring at least a portion of a programmable logic device from a power saving mode, the method comprising:
    switching on a Vcc power supply to configurable logic blocks ("LBs") via a switch in accordance with a first logic value of a sleeping signal from a sleeping controller;
    activating at least a portion of the configurable LBs from a power saving sleep mode ("PSSM") in response to the Vcc power supply;

retrieving configuration data from a memory to program the at least a portion of the configurable LBs;

maintaining active status of the configurable LBs in response to the first logic value of the sleeping signal;

driving at least a portion of the configurable LBs into PSSM in response to termination of the Vcc power supply; and monitoring gradually rising of voltage level of an output voltage to a high impedance ("Hi-Z") indicating that at least a portion of the configurable LBs is in the PSSM.

15. The method of claim 14, further comprising receiving a second logic value of the sleeping signal from the sleeping controller and switching off the Vcc power supply to the configurable LBs.

* * * * *